(12) United States Patent
Yamamoto et al.

(10) Patent No.: US 6,316,826 B1
(45) Date of Patent: Nov. 13, 2001

(54) SEMICONDUCTOR MOUNTING PACKAGE

(75) Inventors: Yoshiyuki Yamamoto; Takahiro Imai, both of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/408,875

(22) Filed: Sep. 29, 1999

(30) Foreign Application Priority Data

Oct. 2, 1998 (JP) .................................................. 10-281662
Sep. 2, 1999 (JP) .................................................. 11-248983

(51) Int. Cl.[7] ................................................ H01L 23/15
(52) U.S. Cl. .......................... 257/705; 257/706; 257/711; 257/713
(58) Field of Search .................................. 257/705, 706, 257/707, 711, 713, 720, 731, 737

(56) References Cited

U.S. PATENT DOCUMENTS

| 3,974,518 | * | 8/1976 | Lewis, Jr. et al. ................... 357/81 |
| 5,137,398 | * | 8/1992 | Omori et al. .......................... 408/145 |
| 5,382,758 | * | 1/1995 | Iaconvangelo et al. ............. 174/262 |
| 5,493,153 | * | 2/1996 | Arikawa et al. ...................... 257/796 |
| 5,629,559 | * | 5/1997 | Miyahara ............................... 257/666 |
| 5,679,895 | * | 10/1997 | von Windheim ................. 73/514.25 |
| 5,834,840 | * | 11/1998 | Robbins et al. ...................... 257/705 |
| 6,071,627 | * | 6/2000 | Yasuda et al. ........................ 428/610 |
| 6,183,874 | * | 6/2001 | Yamagata et al. ................... 428/472 |

FOREIGN PATENT DOCUMENTS

| 63 299238 A | * | 12/1988 | (JP) . |
| 7-99268 | | 4/1995 | (JP) . |

* cited by examiner

Primary Examiner—Nathan Flynn
Assistant Examiner—Ahmed N. Sefer
(74) Attorney, Agent, or Firm—W. F. Fasse; W. G. Fasse

(57) ABSTRACT

A semiconductor mounting package includes at least one diamond member having a first surface on which at least one semiconductor chip is mounted and a second surface opposite the first surface, and a high thermal conductivity metal member adhered to the second surface of the diamond member.

36 Claims, 3 Drawing Sheets

SEMICONDUCTOR MOUNTING PACKAGE

BACKGROUND OF THE INVENTION

1. Field of the Invention

The present invention relates to a semiconductor mounting package for mounting one or a plurality of high power semiconductor chips such as high power transistors and microwave monolithic ICs (MMIC).

2. Description of the Background Art

As output power and operation frequency of a semiconductor chip have been improved, amount of heat generated from the semiconductor chip has been increasing. Further, there is a strong demand in the market to reduce the size and weight of electronic equipments, and therefore packaging density of semiconductor chips has been made higher and higher. Therefore, devices mounting semiconductor chips have been required to satisfy severe conditions of heat radiating characteristic.

In a device of which heat radiating characteristic is required, a material having high thermal conductivity is used as a heat sink to form a substrate, the semiconductor chip is mounted thereon, and heat generated from the semiconductor chip is effectively diffused to prevent overheating of the semiconductor device.

Conventionally, AlN (aluminum nitride) and BeO (beryllium oxide) have been widely used as materials of the heat sink. BeO is disadvantageous in that it has an insufficient heat radiation characteristic and poor machinability, as well as strong toxicity. Though AlN is not toxic, its heat radiation characteristic is poor, and therefore it is not a satisfactory substitute for BeO.

Japanese Patent Laying-Open No. 7-99268 discloses a ceramic package having improved heat radiation characteristic, by adhering a Cu plate on a BeO or AlN substrate. It has been difficult, however, to ensure sufficient heat radiation even by this ceramic package.

Among substances, diamond has the highest thermal conductivity, and hence it is an ideal material to be used as a substrate for the semiconductor chip to lower heat resistance of the device mounting the semiconductor chips such as described above. The problem is that diamond is too expensive for this use.

Chemical vapor deposited diamond which has been under development recently is advantageous in that it allows synthesis over a large area as compared with natural diamond or diamond grown by high pressure and high temperature method and that it is inexpensive. Coefficient of thermal expansion of chemical vapor deposited diamond, however, is smaller than that of the semiconductor chips to be mounted on the substrate formed of the chemical vapor deposited diamond, leading to a problem that after the semiconductor chips are mounted by brazing on the substrate formed of the chemical vapor deposited diamond, the chip cracks.

In view of the foregoing, the inventors of the present invention have proposed in Japanese Patent Application No. 10-6238 (filed on Jan. 16, 1998), a heat spreader in which a substrate of Si (silicon), SiC (silicon carbide) or AlN (aluminum nitride) is coated with thin diamond. The heat spreader two-dimensionally diffuses heat generated film the semiconductor chips through the thin film of diamond, whereby the heat can be dissipated. Further, as the diamond is formed in the form of a thin film, manufacturing cost of diamond is low and effective coefficient of thermal expansion at the surface of the diamond increases, which prevents destruction of the chip at the time of brazing of the semiconductor chips.

SUMMARY OF THE INVENTION

An object of the present invention is to provide a semiconductor mounting package which can improve heat radiating characteristic of a package utilizing diamond, improve cost efficiency and meet increase output of the semiconductor chips to be mounted thereon.

The semiconductor mounting package in accordance with an aspect of the present invention includes one or a plurality of diamond members having one surface (e.g. a first surface) on which one or a plurality of semiconductor chips are mounted and the other surface (e.g. a second surface) opposed to the first surface, and a high thermal conductivity metal member adhered on the aforementioned second surface of the diamond member.

According to another aspect of the present invention, the semiconductor mounting package includes one or a plurality of diamond coated members having one surface (e.g. a first surface) at least partially formed of diamond and on which one or a plurality of semiconductor chips are mounted, and the other surface (e.g. a second surface) opposed to the first surface, and a high thermal conductivity metal member adhered on the aforementioned second surface of the diamond coated member.

In the semiconductor mounting package in accordance with the present invention as described above, the high thermal conductivity metal member is used in order to assist heat spreading effect of diamond. This contributes to reduced amount of diamond used, and maintains or improves heat radiation characteristic of the package as a whole. Therefore, the cost efficiency of the overall semiconductor mounting package can be improved, allowing for increased heat radiation from the semiconductor chips mounted thereon.

When the diamond coated member is used as the member on which the semiconductor chips are to be mounted, it is preferred that the diamond coated member includes a base material and a diamond coating layer formed on a surface of the base material. Here, it is preferred that one surface of the diamond coated member is formed of the diamond coating layer.

In the semiconductor mounting package in accordance with the present invention, preferably, the diamond member or the diamond coating layer is manufacture or formed by chemical vapor deposition method. Chemical vapor deposition method enables formation of diamond having high thermal conductivity over large area at a low cost. Though there are various methods of chemical vapor deposition proposed, any method may be adopted provided that diamond of sufficient area and preferably having thermal conductivity of at least 1000W/m·K can be obtained. For example, microwave plasma assisted CVD method, combustion flame method and hot-filament CVD method may be used.

When the diamond member is used as the member on which the semiconductor chips are to be mounted, it is preferred that the diamond member has the thickness of at least 100 $\mu$m and at most 500 $\mu$m. When the diamond coated member is used as the member on which the semiconductor chips are to be mounted, it is preferred that the diamond coated layer has the thickness of at least 10 $\mu$m and at most 200 $\mu$m.

The base material on which the diamond coating layer is formed preferably includes at least one selected film the group consisting of silicon, aluminum nitride, silicon carbide, copper-tungsten alloy, copper-molybdenum alloy and copper-tungsten-molybdenum alloy.

In the semiconductor mounting package in accordance with the present invention, as to the thermal conductivity of the high thermal conductivity metal member, the higher the better. Preferably, it is at least 300W/m·K and, more preferably, 350W/m·K for sufficient effect.

In the semiconductor mounting package in accordance with the present invention, preferably, the high thermal conductivity metal member includes at least one selected from the group consisting of copper, copper alloy, gold and gold alloy. Further, the material of the high thermal conductivity metal member preferably includes a sintered body. Among the materials listed above, the most preferable is copper, which has highest thermal conductivity and low cost, to be used as the high thermal conductivity metal member.

If the thickness of the high thermal conductivity metal member is too thin, the effect of heat spreading cannot sufficiently be exhibited. When the thickness of the high thermal conductivity metal member is too thick, heat resistance in thickness direction will be too high, degrading heat radiating characteristic of the overall package. Therefore, preferable thickness of the high thermal conductivity metal member is at least 20 $\mu$m and at most 3 mm and, more preferably, at least 40 $\mu$m and at most 1 mm.

In the semiconductor mounting package in accordance with the present invention, the high thermal conductivity metal has one surface adhered on the aforementioned the other surface of the diamond member or the diamond coated member and the other surface opposing to this one surface, and it may further include a second metal member arranged on the aforementioned the other surface of the high thermal conductivity metal member. By this structure, it becomes possible to reinforce the package in mechanical strength and the like by the second metal member.

Preferably, the second metal member includes at least one material selected from the group consisting of copper and copper alloy. Preferably, the material of the second metal member includes a sintered body. Further, the material of the second metal member, preferably, is structured in the form of a clad plate.

Preferably, the semiconductor mounting package in accordance with the present invention further includes a low thermal expansion metal member adhered on the high thermal conductivity metal member, a ceramic member adhered on the low thermal expansion metal member, and a lead member adhered to the ceramic member. By interposing the low thermal expansion metal member which matches the thermal expansion coefficient of ceramics interposed between the high thermal conductivity metal member and the ceramic member, it becomes possible to suppress warpage or cracks resulting film the difference in the coefficients of thermal expansion between the ceramic member and the high thermal conductivity metal member. Thus reliability of the semiconductor chips and the semiconductor mounting package as a whole can further be improved.

The material of the insulating ceramic member preferably includes alumina. Further, the low thermal expansion metal member preferably has average coefficient of thermal expansion of at least $5\times10^{-6}$/° C. and at most $13\times10^{-6}$/° C. in a temperature range from room temperature to the brazing temperature of about 800° C. Preferably, the low thermal expansion metal member includes at least two metals selected from the group consisting of copper, tungsten and molybdenum. Preferably, the low thermal expansion metal member includes a sintered body. Further, the low thermal expansion metal member preferably includes a clad plate.

Preferably, in the semiconductor mounting package in accordance with the present invention, the low thermal expansion metal member and the ceramic member have the shape of a frame surrounding the high thermal conductivity metal member, the low thermal expansion metal member is adhered on a peripheral side surface of the high thermal conductivity metal member, the high thermal conductivity metal member has one surface adhered on the other surface of the diamond member or the diamond coated member and the other surface opposing to this one surface, and the aforementioned the other surface of the high thermal conductivity metal member preferably protrudes outward from the surface of the low thermal expansion metal member. This facilitates efficient escape of the heat transmitted from the diamond member or the diamond coated member to the high thermal conductivity metal member.

In this manner, by the semiconductor mounting package in accordance with the present invention, heat radiation characteristic of the package as a whole can be improved by the use of the diamond member or the diamond coated member and the high thermal conductivity metal member. Therefore, the amount of diamond used to maintain or improve the heat radiating characteristic of the overall package can be reduced and hence manufacturing cost can be reduced.

The foregoing and other objects, features, aspects and advantages of the present invention will become more apparent from the following a detailed description of the present invention when taken in conjunction with the accompanying drawings.

DESCRIPTION OF THE PREFERRED EMBODIMENTS

Figure 1:
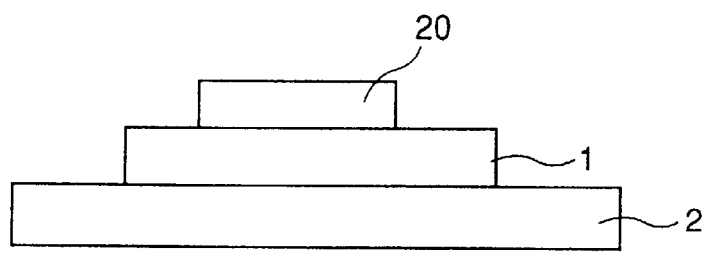
FIG. 1 is a side view representing an embodiment of the semiconductor mounting package in accordance with the present invention using a diamond substrate.

As can be seen from FIG. 1, a semiconductor mounting package in accordance with one embodiment of the present invention includes a diamond substrate 1 on which a semiconductor chip 20 is mounted, and a high thermal conductivity metal member 2 adhered on that surface of diamond substrate 1 which opposes to the surface mounting the semiconductor chip 20. There may be one or a plurality of diamond substrates 1.

Figure 2:
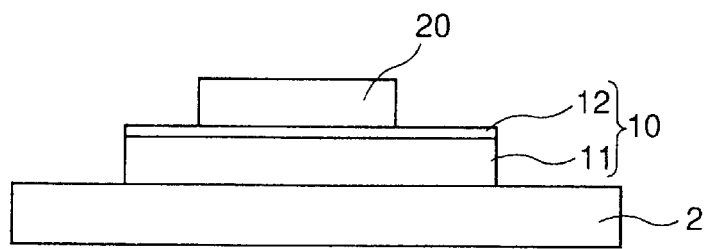
FIG. 2 is a side view of another embodiment of the semiconductor mounting package in accordance with the present invention using a diamond coated substrate.

As can be seen film FIG. 2, a semiconductor mounting package in accordance with another embodiment of the present invention includes a diamond coated substrate 10 having a surface partially or entirely coated with diamond, and a high thermal conductivity metal member 2. Diamond coated substrate 10 includes a substrate 11 and a diamond coating layer 12 formed on one surface of substrate 11. A semiconductor chip 20 is mounted on diamond coated layer 12. High thermal conductivity metal member 2 is adhered to that surface of diamond coated substrate 10 which is opposite to the surface on which semiconductor chip is mounted, that is, adhered to the surface of substrate 11. Preferably, substrate 11 contains at least one of silicon, aluminum nitride, silicon carbide and copper-tungsten alloy, and may include copper-molybdenum alloy or copper-tungsten-molybdenum alloy. There may be one or more diamond coated substrates 10. Further, a plurality of semiconductor chips may be mounted on a plurality of diamond substrates 1 or diamond coated substrates 10, respectively.

Preferably, diamond substrate 1 or diamond coating layer 12 is manufactured or formed by chemical vapor deposition method. After the diamond is synthesized by chemical vapor deposition method, the growth surface is mirror polished, and the diamond is cut into necessary size by laser beam or the like. Though it depends on the shape of the semiconductor chip to be mounted or the state of distribution of heat generating portions of the semiconductor chip, the size is preferably about twice to ten times the area of the semiconductor chip to be mounted.

On the surface of diamond substrate 1 or diamond coating layer 12 on which semiconductor chip 20 is mounted, a metallization layer containing at least one selected film gold (Au), molybdenum (Mo), nickel (Ni), platinum (Pt), palladium (Pd), titanium (Ti), copper (Cu), aluminum (Al) and the like is formed for adhering semiconductor chip 20. On the metallization layer, the semiconductor chip is fixed by a brazing filler material such as gold-tin (Au—Sn) alloy, gold-germanium (Au—Ge) alloy, gold-silicon (Au—Si) alloy or the like. Preferably, the thickness of the metallization layer and the brazing filler layer together is preferably about 0.1 to about 50 µm.

The area of the high thermal conductivity metal member 2 should preferably be the same or larger than the area of diamond substrate 1 or a diamond coated substrate 10.

High thermal conductivity metal member 2 must not be arranged on that surface of diamond substrate 1 or diamond coated substrate 10 on which semiconductor chip 20 is to be mounted. The reason for this is as follows. Thermal conductivity of high thermal conductivity metal member 2 is lower than thermal conductivity of diamond (at least 1000W/m·K), and therefore if the high thermal conductivity metal member 2 is interposed between semiconductor chip 20 and that surface of diamond substrate 1 or diamond coated substrate 10 on which semiconductor chip 20 is mounted, the effect of thermal diffusion of diamond would be hindered.

Figure 3:
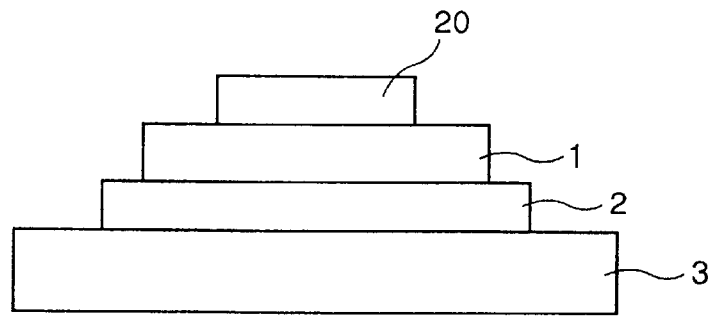
FIG. 3 is a side view representing yet another embodiment of the semiconductor mounting package in accordance with the present invention using a diamond substrate and a second metal member.
Figure 4:
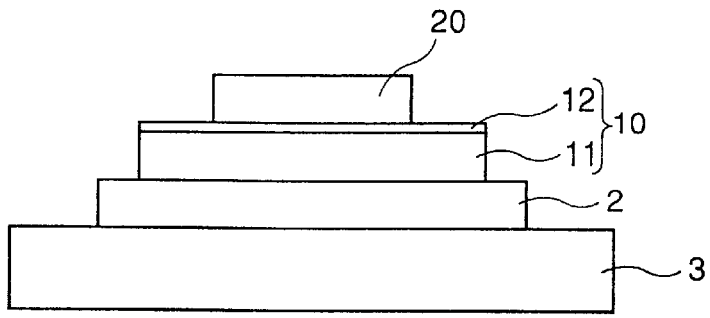
FIG. 4 is a side view representing a still further embodiment of the semiconductor mounting package in accordance with the present invention using a diamond coated substrate and a second metal member.

The high thermal conductivity metal member 2 may directly be attached on a printed board or the like. If it is problematic in view of mechanical strength or the like, high thermal conductivity metal member 2 may be attached on the printed board or the like with a second metal member interposed. When the semiconductor chip 20 is to be mounted on diamond substrate 1 as shown in FIG. 3, the second metal member 3 may be arranged on that surface of high thermal conductivity metal member 2 which is opposite to the surface on which diamond substrate 1 is adhered. When semiconductor chip 20 is to be mounted on diamond coated substrate as shown in FIG. 4, the second metal member 3 may be arranged on that surface of high thermal conductivity metal member 2 which is opposite to that surface on which diamond coated substrate 10 is adhered.

As the material of the second metal member 3, general package base material such as a dad plate of copper, copper-tungsten alloy, copper-molybdenum alloy or copper-molybdenum-copper may be used. Here, a metallization layer containing at least one metal selected from gold (Au), molybdenum (Mo), titanium (Ti), nickel (Ni), platinum (Pt), copper (Cu), aluminum (Al) and the like is formed, and by using a brazing filler mainly consisting of gold-tin (Au—Sn) alloy, gold-silicon (Au—Si) alloy or silver (Ag), the second metal member 3 is brazed on high thermal conductivity metal member 2.

The shape of the second metal member 3 at a portion where high thermal conductivity metal member 2 is attached may be made thin, corresponding to the thickness of high thermal conductivity metal member 2. Alternatively, a screw hole or the like for attachment on a printed board or the like may be formed in the second metal member 3.

When the second metal member 3 is not used, high thermal conductivity metal member 2 may have a screw hole for attachment on a printed board or the like.

Figure 5:
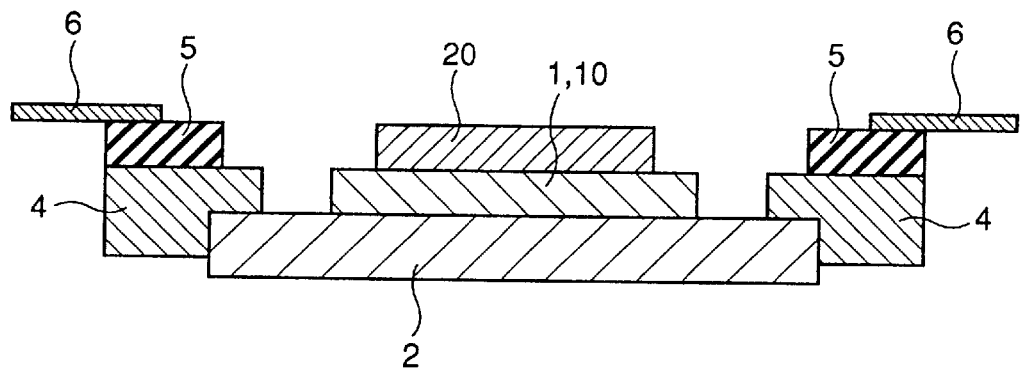
FIG. 5 is a cross sectional side view representing a specific example of the semiconductor mounting package in accordance with the present invention using a low thermal expansion metal member and a ceramic member.
Figure 6:
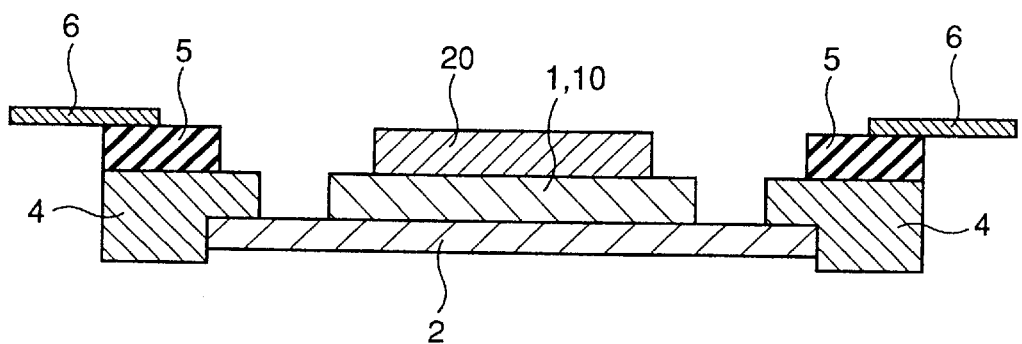
FIG. 6 is a cross sectional side view representing another specific example of the semiconductor mounting package in accordance with the present invention using a low thermal expansion metal member and a ceramic member.
Figure 7:
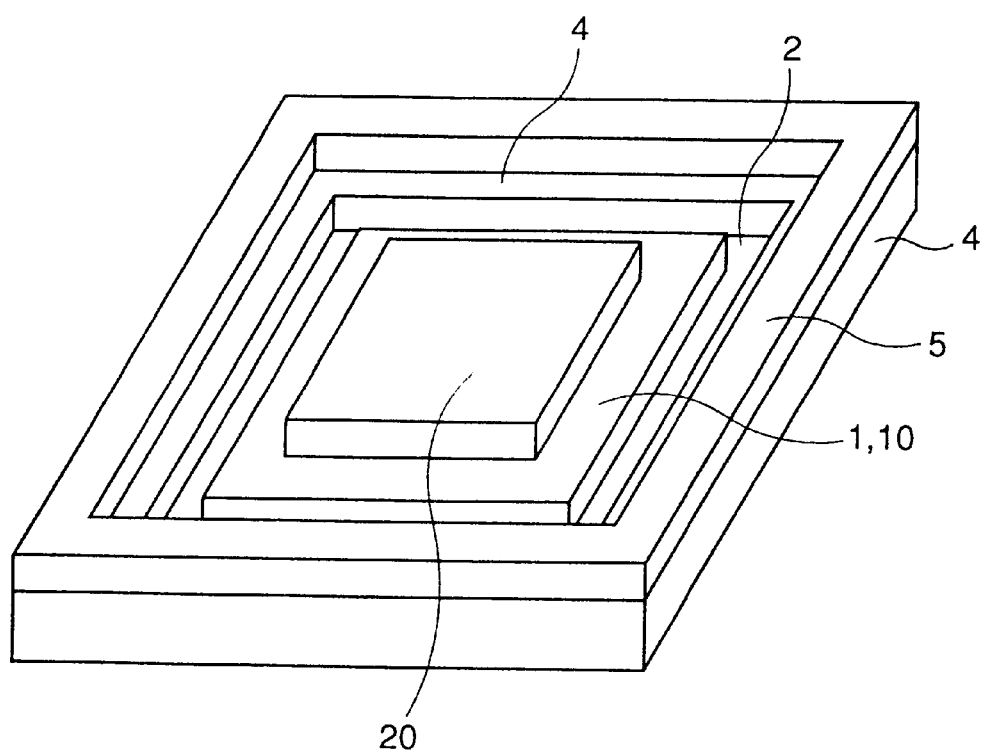
FIG. 7 is a perspective view of the semiconductor mounting package shown in FIG. 5 or 6.

When a lead member such as a lead frame for inputting/outputting a signal to the semiconductor chip is to be attached to the high thermal conductivity metal member, it is generally necessary that the lead member and the high thermal conductivity metal member are electrically insulated. Therefore, the lead member is attached with an insulating ceramic member interposed. Referring to FIG. 7, in a specific example of the semiconductor mounting package for attaching a lead member 6 (FIG. 5 or 6) such as a lead flame, low thermal expansion metal member 4 and a ceramic member are formed in the shape of a frame. Low thermal expansion metal 5 member 4 and ceramic member 5 are adhered by brazing. High thermal conductivity metal member 2 is inserted into the frame shaped low thermal expansion metal member 4 and ceramic member 5, and diamond substrate 1 or diamond coated substrate 10 is placed on its surface. Here, a screw hole for attachment on a printed board or the like may be provided in low thermal expansion metal member 4. Further, as shown in FIG. 5, bottom surface of high thermal conductivity metal member 2 should preferably protrude to some extent from the opening of the frame of low thermal expansion metal member 4. This facilitates efficient escape of heat to the outside, which heat has been transmitted from diamond to high thermal conductivity metal member 2.

On surfaces of high thermal conductivity metal member 2, low thermal expansion metal member 4, ceramic member 5 and lead member 6, a metallization layer containing at least one selected from gold (Au), molybdenum (Mo), titanium (Ti), nickel (Ni), platinum (Pt), copper (Cu), aluminum, (Al) and the like is formed. As can be seen film FIGS. 5 and 6, by using a gold based brazing filler such as gold-tin (Au—Sn) alloy, gold-silicon (Au—Si) alloy or silver (Ag), low thermal expansion metal member 4 is adhered to high thermal conductivity metal member 2, ceramic member 5 is adhered to low thermal expansion metal member 4, and lead member 6 is adhered to ceramic member 5.

As the material of ceramic member 5, alumina or ceramics mainly consisting of alumina should preferably be used. As the low thermal expansion metal member 4 to be adhered to ceramic member 5, the sintered body of copper-tungsten (Cu—W) alloy, Kovar (trade name: alloy of iron (Fe)-nickel (Ni)-cobalt (Co)), a clad plate of copper-molybdenum-copper (Cu—Mo—Cu) or the like may be used. Particularly, the sintered body of copper-tungsten alloy is most preferable as the material of low thermal expansion metal member 4, as the difference in the coefficient of thermal expansion from alumina is small.

EXAMPLE 1

Semiconductor mounting packages of the present invention shown in FIGS. 1 to 4 were manufactured. For the structures of the semiconductor mounting packages shown in FIGS. 1 and 2, the packages in such a shape as shown in FIGS. 5 and 6 were manufactured. The method of manufacturing each of the members constituting the semiconductor mounting packages of the present invention will be described in detail in the following.

(1) Diamond Coated Substrate 10

Substrates (thickness: 0.4 mm, size: 20 mm×20 mm) of silicon (Si), aluminum nitride (AlN) and copper-tungsten (Cu—W), respectively, were prepared. Surfaces of respective substrates were scratched by using diamond powder, and thereafter, diamond was grown by hot-filament CVD method. The condition of growth was as follows. Raw material gas was hydrogen gas containing 1.2 vol.% of methane gas, flow rate was 500 sccm (0° C., flow rate cm$^3$/min at 1 atmospheric pressure), pressure was 70 Torr, substrate temperature was 710° C., the filament was tungsten and filament temperature was 2090° C. Diamond film thickness was set to be 20 μm, 50 μm and 100 μm after polishing. Thermal conductivity of the diamond film was measured by laser flash method and it was 1240 W/m·K.

After the surface of the diamond film was polished, the substrates were cut into the size of 10 mm×5 mm by using a laser beam, and polished until the overall thickness attained 0.4 mm. Thereafter, a metallization layer was formed on all surfaces, including side surfaces, of the diamond coated substrates. The composition of the metallization layer was, from the surface, gold (Au) layer of 3 μm in thickness/platinum (Pt) layer of 0.05 μm in thickness/ titanium (Ti) layer of 0.01 μm in thickness.

(2) Diamond Substrate 1

On a silicon (Si) substrate, diamond was grown under the same condition as in the manufacturing of the (1) diamond coated substrate. The film thickness of diamond was set to be 200 μm, 300 μm and 400 μm after polishing. After polishing, the silicon substrate was removed and a diamond substrate was obtained. The diamond substrate was cut into the size of 10 mm×5 mm by using a laser beam. Thereafter, on all the surfaces of diamond substrate including side surfaces, a metallization layer was formed under the same condition as in the manufacturing of the diamond coated substrate.

(3) High Thermal Conductivity Metal Member 2 Copper plates of three different thicknesses, that is, D=0.1 mm, 0.5 mm and 3 mm were prepared as the high thermal conductivity metal member. The size of each copper plate was 11 mm×8 mm.

(4) Second Metal Member 3

A metal plate formed of copper-tungsten (Cu—W) alloy was prepared. The metal plate had the thickness of 1.6 mm and the size of 15 mm×10 mm.

Using these members prepared in the above described manner, the semiconductor mounting packages such as shown in FIGS. 1 to 4 were manufactured.

In manufacturing the semiconductor mounting package shown in FIG. 3 or 4, on the metal plate of copper-tungsten alloy as the second metal member 3, a brazing filler of gold-germanium (Au—Ge) alloy, a copper plate as the high thermal conductivity metal member 2 and brazing filler of gold-germanium alloy were stacked in this order, and diamond substrate 1 or diamond coated substrate 10 was placed thereon and heated, so that the members were adhered to each other. Thereafter, on diamond substrate 1 or diamond coating layer 12, a silicon microwave power semiconductor chip 20 was adhered, and thus a package mounting a semiconductor chip was manufactured.

In manufacturing the semiconductor package shown in FIG. 1 or 2, on that surface of diamond substrate 1 or diamond coated substrate 10 which was opposite to the surface on which the semiconductor chip was mounted, a copper plate as high thermal conductivity metal member 2 was adhered by using a brazing filler of gold-germanium alloy, and thus the semiconductor mounting package was completed. In the semiconductor mounting package shown in FIG. 1 or 2, the structure shown in FIG. 5 or 6 was adopted. As the material of low thermal expansion metal member 4, a sintered body of copper-tungsten (Cu—W) alloy was used, and as ceramic member 5, alumina was used. In order that the copper plate as high thermal conductivity metal member 2 was fitted in the frame of low thermal expansion metal member 4, a step having the width of 1.5 mm and the height of 0.2 mm was formed over the entire periphery of the copper plate. With the brazing filler of silver (Ag) placed at the step, the copper plate was fitted into the frame of the sintered body of copper-tungsten alloy, and together with alumina as ceramic member 5, brazed with silver solder. Thereafter, copper plate as high thermal conductivity metal member 2 was adhered on diamond substrate 1 or diamond coated substrate 10 by using a brazing filler of gold-germanium alloy. Samples in which the bottom surface of high thermal conductivity metal member 2 was protruded by about 0.1 from the bottom surface of low thermal expansion metal member 4 as shown in FIG. 5, and samples in which the bottom surface of high thermal conductivity metal member 2 was recessed by about 0.1 mm from the bottom surface of low thermal expansion metal member 4 were both manufactured. Thereafter, on diamond substrate 1 or diamond coated substrate 10, a silicon microwave power semiconductor chip 20 was adhered.

Heat resistance of the semiconductor mounting packages fabricated in the above described manner was measured. The semiconductor chip was operated by applying a prescribed input signal to the semiconductor chip 20. At that time, the temperature at the bottom surface of the package was measured by a thermocouple, and temperature of the surface of the semiconductor chip was measured by a radiation thermometer. By using these measurements, heat resistance of the overall package was calculated in accordance with the following equation.

Heat resistance=(chip surface temperature−package bottom surface temperature)/(input power−output power)

For comparison, the semiconductor chip was directly adhered on a metal substrate formed of copper-tungsten alloy having the thickness of 1.6 mm and the size of 15 mm×10 mm. Heat resistance of this sample measured in accordance with the above described method was assumed to be 1.

The measured values shown in Table 1 represent relative values of heat resistance in the measured value of heat resistance of the sample in which the semiconductor chip was directly adhered on the metal substrate assumed to be 1. Therefore, it means that the lower the relative value, the smaller the heat resistance. In Tables 1, 2 and 3, thickness D (mm)=0 of the copper plate represents a structure in which copper plate as high thermal conductivity metal member 2 was not used in the structure of the semiconductor mounting package.

TABLE 1

| | Thickness of Diamond | | Thickness of Copper Plate D(mm) | | | |
|---|---|---|---|---|---|---|
| | (μm) | Structure | 0 | 0.1 | 0.5 | 3 |
| Diamond Substrate | 200 | FIG. 3 | 0.55 | 0.48 | 0.46 | 0.65 |
| | 300 | | 0.48 | 0.45 | 0.44 | 0.63 |
| | 400 | | 0.45 | 0.43 | 0.42 | 0.59 |
| | 300 | FIG. 1 (FIG. 5) | | | 0.41 | |
| | 300 | FIG. 1 (FIG. 6) | | | 0.95 | |
| Diamond Coated Substrate | | | | | | |
| Si | 20 | FIG. 4 | 0.83 | 0.78 | 0.75 | |
| | 50 | | 0.78 | 0.76 | 0.74 | |
| | 100 | | 0.75 | 0.73 | 0.72 | |
| | 50 | FIG. 2 (FIG. 5) | | | 0.68 | |
| | 50 | FIG. 2 (FIG. 6) | | | 1.10 | |
| AlN | 20 | FIG. 4 | 0.81 | 0.77 | 0.75 | |
| | 50 | | 0.76 | 0.74 | 0.73 | |
| CuW | 20 | FIG. 4 | 0.79 | 0.77 | 0.76 | |
| | 50 | | 0.71 | 0.70 | 0.68 | |

It can be seen from Table 1 that in the semiconductor mounting package of FIG. 2 or FIG. 4 using the diamond coated substrate, relative heat resistance value was smaller than 1, and in the semiconductor mounting package of FIG. 1 or FIG. 3 using diamond substrate 1, the relative heat resistance value was further lowered.

When the thickness D of the copper plate as high thermal conductivity metal member 2 was 0.1 mm and 0.5 mm, relative heat resistance value was lower than when the copper plate was not used (D=0). It can be seen, however, that when the thickness D of the copper plate was extremely large (D=3 mm), the relative heat resistance value was, on the contrary, increased.

Though relative heat resistance value of the semiconductor mounting package not using the second metal member 3 (FIG. 1 (FIG. 5) or FIG. 2 (FIG. 5)) was slightly lower than when the second metal member was used (FIG. 3 or FIG. 4), the change was very slight. The reason for this is that because of the diamond substrate 1 or diamond coated substrate 10 and high thermal conductivity metal member 2, the heat generated from semiconductor chip 20 could sufficiently be diffused two-dimensionally, and by the time the heat reaches the second metal member 3, the heat entering per unit area has been significantly reduced.

Further, it can be seen that in the structure not using the second metal member 3 (FIG. 1 or 2), when the bottom surface of high thermal conductivity metal member 2 is recessed from the bottom surface of low thermal expansion metal member 4 as shown in FIG. 6, the relative heat resistance value attains higher.

As a comparative example, a semiconductor mounting package having a copper plate inserted between diamond substrate 1 and semiconductor chip 20 was fabricated. On one surface of the diamond substrate manufactured in the above described manner, a brazing filler of gold-germanium alloy and a copper plate having the thickness D and the size of 15 mm×10 mm were stacked and heated for adhesion. On an opposite side surface of diamond substrate, the second metal member 3 prepared in the above described manner was adhered. The semiconductor chip was adhered on the copper plate. Using the samples of the semiconductor mounting package, relative heat resistance value was measured in the similar manner as in the above examples. The results of measurement are as shown in Table 2.

TABLE 2

| | Thickness of | Thickness of Copper Plate D (mm) | | | |
|---|---|---|---|---|---|
| | Diamond (μm) | 0 | 0.1 | 0.5 | 3 |
| Diamond Substrate | 200 | 0.55 | 0.75 | 1.05 | 1.58 |

From Table 2, it can be seen that when a copper plate was inserted between the diamond substrate and the semiconductor chip, heat radiating property was significantly degraded as compared with the examples of the semiconductor mounting packages shown in FIGS. 1 to 4 without copper plate inserted therebetween (results of measurement of relative heat resistance value shown in Table 1).

EXAMPLE 2

Using the diamond substrate or the diamond coated substrate manufactured in the above described manner, four substrates each having the size of 2.4 mm×5 mm were fabricated. Packages each having one semiconductor chip similar to that of the example 1 mounted on the diamond substrate or the diamond coated substrate were fabricated in the similar manner as described in example 1. Relative heat resistance value of each semiconductor mounting package was measured in the similar manner as in the example 1. The results of measurement are as shown in Table 3.

TABLE 3

| | | Thickness of Diamond | | Thickness of Copper Plate D (mm) | | | |
|---|---|---|---|---|---|---|---|
| | | (μm) | Structure | 0 | 0.1 | 0.5 | 3 |
| Diamond Substrate | | 300 | FIG 3 | 0.49 | 0.44 | 0.43 | 0.65 |
| | | 300 | FIG. 1 (FIG. 5) | | | 0.40 | |
| | | 300 | FIG. 1 (FIG. 6) | | | 0.98 | |
| Diamond Coated Substrate | Si | 20 | FIG. 4 | 0.85 | 0.79 | 0.77 | |
| | | | FIG. 2 (FIG. 5) | | | 0.70 | |
| | | | FIG. 2 (FIG. 6) | | | 1.23 | |
| | AlN | 20 | FIG. 4 | 0.83 | 0.79 | 0.76 | |
| | CuW | 20 | FIG. 4 | 0.79 | 0.78 | 0.75 | |

As can be seen from Table 3, in the semiconductor mounting package shown in FIG. 1 or 2, when the bottom surface of the copper plate as high thermal conductivity metal member 2 was protruded as shown in FIG. 5, relative heat resistance value was almost the same as that of the package having such a structure as shown FIG. 3 or 4 using the second metal member 3. When the bottom surface of the copper plate was recessed as shown in FIG. 6 in the structure of FIG. 1 or 2, however, relative heat resistance value was close to 1, which was considerably high. When the bottom surface of the copper plate is recessed, the heat is once transmitted from the copper plate as high thermal conductivity metal plate 2 to low thermal expansion metal member 4 (FIG. 6), and thereafter the heat is radiated from the low thermal expansion metal member 4, resulting in low heat radiation efficiency.

As described above, as the diamond and the high thermal conductivity metal member are adopted in the structure of the semiconductor mounting package in accordance with the present invention, heat radiation characteristic of the overall package can be improved.

Although the present invention has been described and illustrated in detail, it is dearly understood that the same is by way of illustration and example only and is not to be taken by way of limitation, the spirit and scope of the present invention being limited only by the terms of the appended claims.

What is claimed is:

1. A semiconductor mounting package comprising:
   at least one diamond member having a first surface and a second surface respectively opposite each other;
   at least one semiconductor chip mounted on said first surface of said at least one diamond member;
   a high thermal conductivity metal member having a first surface and a second surface respectively opposite each other, and a peripheral side surface on a peripheral side thereof, wherein said first surface of said high thermal conductivity metal member is adhered to said second surface of said at least one diamond member;
   a frame that surrounds said high thermal conductivity metal member, and that comprises a low thermal expansion metal member adhered on said peripheral side surface of said high thermal conductivity metal member, and a ceramic member adhered to said low thermal expansion metal member, wherein said second surface of said high thermal conductivity metal member protrudes outward from a surface of said low thermal expansion metal member; and
   a lead member adhered to said ceramic member.

2. The semiconductor mounting package according to claim 1, wherein said diamond member comprises chemical vapor deposited diamond.

3. The semiconductor mounting package according to claim 1, wherein said diamond member has a thickness of at least 100 µm and at most 500 µm.

4. The semiconductor mounting package according to claim 1, wherein said high thermal conductivity metal member has a thermal conductivity of at least 300 W/m·K.

5. The semiconductor mounting package according to claim 1, wherein said high thermal conductivity metal member includes at least one material selected from the group consisting of copper, copper alloy, gold and gold alloy.

6. The semiconductor mounting package according to claim 5, wherein said high thermal conductivity metal member includes a sintered body.

7. The semiconductor mounting package according to claim 1, wherein said high thermal conductivity metal member has a thickness of at least 20 µm and at most 3 mm.

8. The semiconductor mounting package according to claim 1, further comprising a second metal member arranged on said second surface of said high thermal conductivity metal member.

9. The semiconductor mounting package according to claim 8, wherein said second metal member includes at; least one material selected from the group consisting of copper and copper alloy.

10. The semiconductor mounting package according to claim 9, wherein said second metal member includes a sintered body.

11. The semiconductor mounting package according to claim 9, wherein said second metal member includes a clad plate.

12. The semiconductor mounting package according to claim 1, wherein said ceramic member includes alumina.

13. The semiconductor mounting package according to claim 1, wherein said low thermal expansion metal member has an average coefficient of thermal expansion of at least $5 \times 10^{-6}/°$ C. and at most $13 \times 10^{-6}/°$ C. in a temperature range from room temperature to 800° C.

14. The semiconductor mounting package according to claim 1, wherein said low thermal expansion metal member includes at least two metals selected from the group consisting of copper, tungsten and molybdenum.

15. The semiconductor mounting package according to claim 14, wherein said low thermal expansion metal member includes a sintered body.

16. The semiconductor mounting package according to claim 14, wherein said low thermal expansion metal member includes a clad plate.

17. The semiconductor mounting package according to claim 1, wherein said high thermal conductivity metal member has a thermal conductivity of at least 300 W/m·K, and said low thermal expansion metal member has an average coefficient of thermal expansion of at least $5 \times 10^{-6}/°$ C. and at most $13 \times 10^{-6}/°$ C. in a temperature range from room temperature to 800° C.

18. A semiconductor mounting package comprising:
    at least one diamond coated member having a first surface at least partially formed of diamond and a second surface opposite thereto;
    at least one semiconductor chip mounted on said first surface of said at least one diamond coated member;
    a high thermal conductivity metal member having a first surface and a second surface respectively opposite each other, and a peripheral side surface on a peripheral side thereof, wherein said first surface of said high thermal conductivity metal member is adhered to said second surface of said at least one diamond coated member;
    a frame that surrounds said high thermal conductivity metal member, and that comprises a low thermal expansion metal member adhered on said peripheral side surface of said high thermal conductivity metal member, and a ceramic member adhered to said low thermal expansion metal member, wherein said second surface of said high thermal conductivity metal member protrudes outward from a surface of said low thermal expansion metal member; and
    a lead member adhered to said ceramic member.

19. The semiconductor mounting package according to claim 18, wherein said diamond coated member includes a base material and a diamond coating layer formed on a surface of said base material, wherein said first surface of said diamond coated member is formed of said diamond coating layer.

20. The semiconductor mounting package according to claim 19, wherein said diamond coating layer comprises chemical vapor deposited diamond.

21. The semiconductor mounting package according to claim 19, wherein said diamond coating layer has a thickness of at least 10 µm and at most 200 µm.

22. The semiconductor mounting package according to claim 19, wherein said base material includes at least one material selected from the group consisting of silicon, aluminum nitride, silicon carbide, copper-tungsten alloy, copper-molybdenum alloy and copper-tungsten-molybdenum alloy.

23. The semiconductor mounting package according to claim 18, wherein said high thermal conductivity metal member has a thermal conductivity of at least 300 W/m·K.

24. The semiconductor mounting package according to claim 18, wherein said high thermal conductivity metal member includes at least one material selected from the group consisting of copper, copper alloy, gold and gold alloy.

25. The semiconductor mounting package according to claim 24, wherein said high thermal conductivity metal member includes a sintered body.

26. The semiconductor mounting package according to claim 18, wherein said high thermal conductivity metal member has a thickness of at least 20 $\mu$m and at most 3 mm.

27. The semiconductor mounting package according to claim 18, further comprising a second metal member arranged on said second surface of said high thermal conductivity metal member.

28. The semiconductor mounting package according to claim 27, wherein said second metal member includes at least one material selected from the group consisting of copper and copper alloy.

29. The semiconductor mounting package according to claim 28, wherein said second metal member includes a sintered body.

30. The semiconductor mounting package according to claim 28, wherein said second metal member includes a clad plate.

31. The semiconductor mounting package according to claim 18, wherein said ceramic member includes alumina.

32. The semiconductor mounting package according to claim 18, wherein said low thermal expansion metal member has an average coefficient of thermal expansion of at least $5\times10^{-6}$/° C. and at most $13\times10^{-6}$/° C. in a temperature range from room temperature to 800° C.

33. The semiconductor mounting package according to claim 18, wherein said low thermal expansion metal member includes at least two metals selected from the group consisting of copper, tungsten and molybdenum.

34. The semiconductor mounting package according to claim 33, wherein said low thermal expansion metal member includes a sintered body.

35. The semiconductor mounting package according to claim 33, wherein said low thermal expansion metal member includes a clad plate.

36. The semiconductor mounting package according to claim 18, wherein said high thermal conductivity metal member has a thermal conductivity of at least 300 W/m·K, and said low thermal expansion metal member has an average coefficient of thermal expansion of at least $5\times10^{-6}$/° C. and at most $13\times10^{-6}$/° C. in a temperature range from room temperature to 800° C.

* * * * *

UNITED STATES PATENT AND TRADEMARK OFFICE
CERTIFICATE OF CORRECTION

PATENT NO. : 6,316,826 B1
DATED : November 13, 2001
INVENTOR(S) : Yamamoto et al.

It is certified that error appears in the above-identified patent and that said Letters Patent is hereby corrected as shown below:

Column 2,
Line 67, after "selected", replace "film" by -- from --.

Column 5,
Line 6, after "seen", replace "film" by -- from --;
Line 37, after "selected" replace "film" by -- from --.

Column 6,
Line 12, after "a", replace "dad" by -- clad --;
Line 40, (actual line count), after "lead" replace "flame" by -- frame --.

Signed and Sealed this

Second Day of April, 2002

Attest:

JAMES E. ROGAN
*Attesting Officer*     *Director of the United States Patent and Trademark Office*